(12) United States Patent
Hayashida et al.

(10) Patent No.: US 9,748,509 B2
(45) Date of Patent: Aug. 29, 2017

(54) ORGANIC EL ELEMENT AND ORGANIC EL DISPLAY PANEL

(71) Applicant: JOLED INC., Tokyo (JP)

(72) Inventors: Yoshiki Hayashida, Tokyo (JP); Takayuki Shimamura, Tokyo (JP); Jun Hashimoto, Tokyo (JP); Makoto Kimura, Hyogo (JP); Hiroyuki Masuda, Cupertino, CA (US)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 14/903,097

(22) PCT Filed: Jul. 3, 2014

(86) PCT No.: PCT/JP2014/003555
§ 371 (c)(1),
(2) Date: Jan. 6, 2016

(87) PCT Pub. No.: WO2015/004889
PCT Pub. Date: Jan. 15, 2015

(65) Prior Publication Data
US 2016/0133867 A1    May 12, 2016

(30) Foreign Application Priority Data
Jul. 10, 2013 (JP) ................. 2013-144358

(51) Int. Cl.
*H01L 51/50* (2006.01)
*H01L 51/52* (2006.01)

(52) U.S. Cl.
CPC ...... *H01L 51/5076* (2013.01); *H01L 51/5253* (2013.01)

(58) Field of Classification Search
CPC ................ H01L 51/5076; H01L 51/5253
See application file for complete search history.

(56) References Cited

U.S. PATENT DOCUMENTS

| 5,443,922 A | 8/1995 | Nishizaki et al. |
| 6,509,109 B1 | 1/2003 | Nakamura et al. |

(Continued)

FOREIGN PATENT DOCUMENTS

| EP | 2360752 | 8/2011 |
| JP | 5-163488 | 6/1993 |

(Continued)

OTHER PUBLICATIONS

International Search Report (ISR) from International Searching Authority (Japan Patent Office) in International Pat. Appl. No. PCT/JP2014/003555, dated Sep. 30, 2014.

(Continued)

*Primary Examiner* — Douglas Menz
(74) *Attorney, Agent, or Firm* — Greenblum & Bernstein, P.L.C.

(57) ABSTRACT

An organic electroluminescence (EL) element that has an anode; a cathode; an organic light-emitting layer between the anode and the cathode that emits light according to recombination of holes injected from the anode and electrons injected from the cathode; and an electron transport layer between the cathode and the organic light-emitting layer that transports electrons from the cathode to the organic light-emitting layer. The electron transport layer includes an n-type dopant that includes an electron-donating substance, the electron transport layer being doped with the n-type dopant at a doping concentration that is higher than a doping concentration at which light emittance efficiency of the organic light-emitting layer is greatest.

9 Claims, 11 Drawing Sheets

Enlargement of portion A

(56) References Cited

U.S. PATENT DOCUMENTS

| | | |
|---|---|---|
| 7,952,273 B2 | 5/2011 | Do et al. |
| 8,445,895 B2 | 5/2013 | Okumoto et al. |
| 9,121,914 B2 | 9/2015 | Shimamura et al. |
| 2008/0136321 A1 | 6/2008 | Do et al. |
| 2010/0237341 A1 | 9/2010 | Okumoto et al. |
| 2011/0180792 A1 | 7/2011 | Lee et al. |

FOREIGN PATENT DOCUMENTS

| | | |
|---|---|---|
| JP | 11-354283 | 12/1999 |
| JP | 2000-113976 | 4/2000 |
| JP | 2008-147630 | 6/2008 |
| JP | 2008-219033 | 9/2008 |
| JP | 2009-266832 | 11/2009 |
| JP | 2010-153820 | 7/2010 |
| JP | 2011-522391 | 7/2011 |
| JP | 2012-504847 | 2/2012 |
| WO | 2009/147801 | 12/2009 |
| WO | 2012/023177 | 2/2012 |

OTHER PUBLICATIONS

U.S. Appl. No. 14/964,941 to Jun Hashimoto et al., filed Dec. 10, 2015.

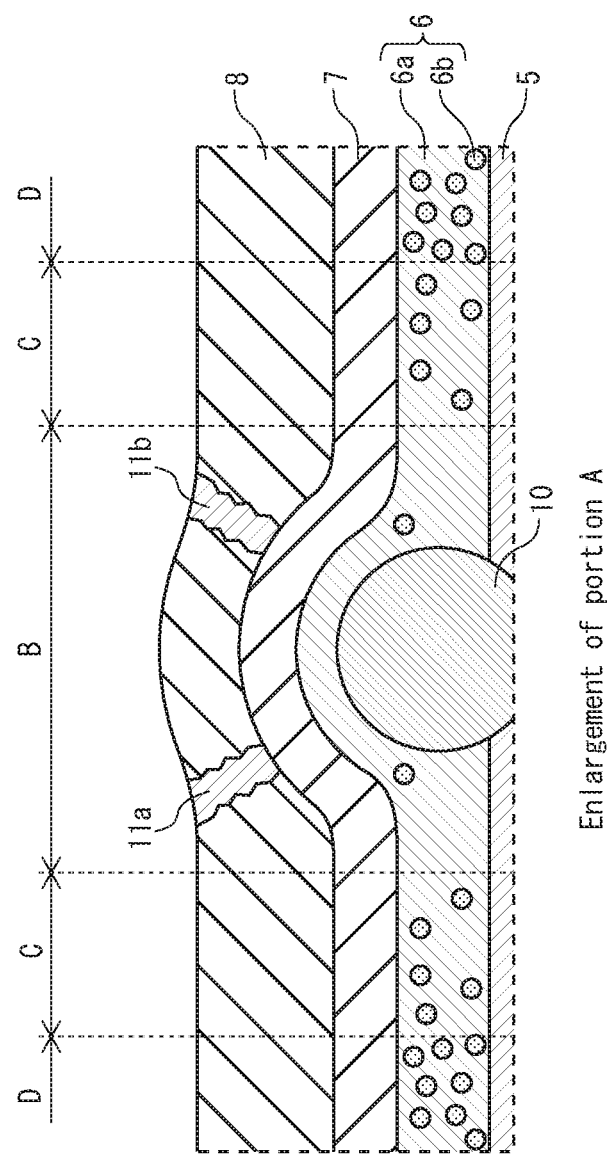

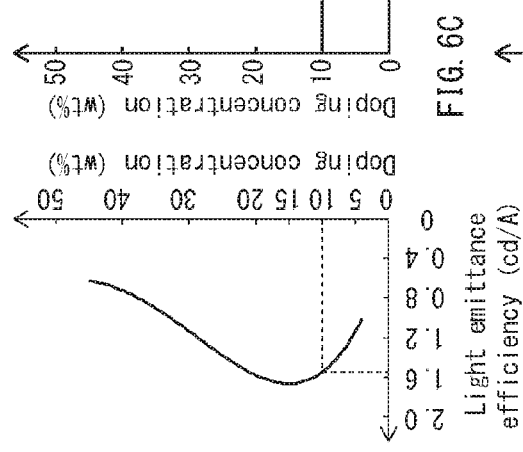
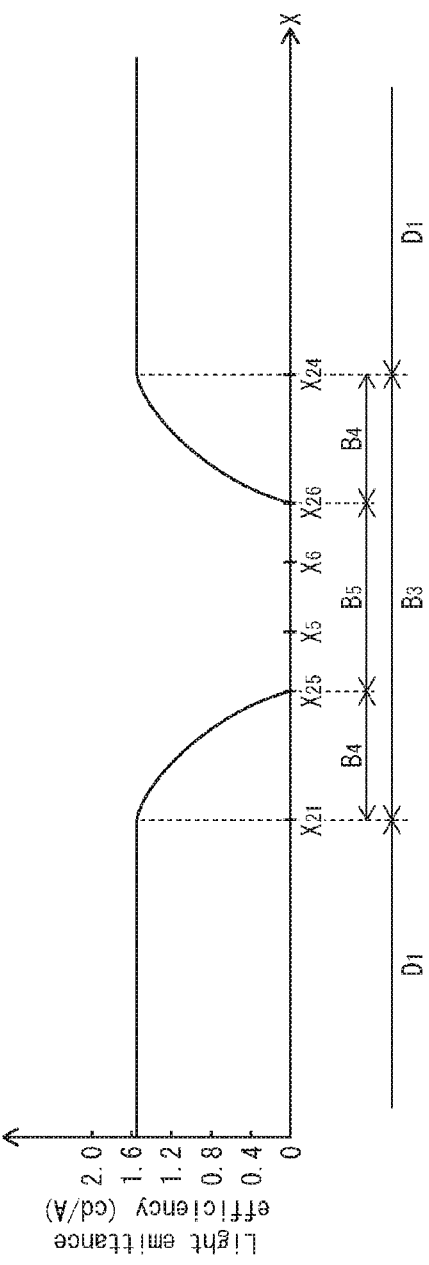

ORGANIC EL ELEMENT AND ORGANIC EL DISPLAY PANEL

TECHNICAL FIELD

The present invention relates to structure of organic electroluminescence (EL) elements.

BACKGROUND ART

An organic EL element is a current-driven light-emitting element that has a structure in which an organic light-emitting layer is disposed between a pair of an anode and a cathode, electroluminescence in the organic light-emitting layer occurring due to recombination of carriers (holes, electrons). Further, a sealing layer is provided above the cathode, because organic material used in the organic light-emitting layer degrades when reacted with water, oxygen, etc.

In recent years, in addition to the structure described above, an electron transport layer having high electron mobility is being provided between the anode and the organic light-emitting layer in order to improve light emittance efficiency. Patent Literature 1 discloses technology for improving light emittance efficiency of an organic EL element by increasing electron mobility of an electron transport layer through doping the electron transport layer with an n-type dopant including an electron-donating substance such as an alkali metal.

CITATION LIST

Patent Literature

Patent Literature 1
Japanese translation of PCT application 2012-504847

SUMMARY OF INVENTION

Technical Problem

During the process of manufacturing the organic EL element, tiny piece of foreign matter adhering may cause unwanted cracks in the sealing layer. Further, when localized three is applied to the organic EL element during use, cracks may occur in the sealing layer. In these cases, water, oxygen, etc., that enters from the crack in the sealing layer reacts with the n-type dopant included in the electron transport layer, reducing the doping concentration of the n-type dopant. As a result, light emittance efficiency associated with the electron transport layer decreases, and defective light-emitting regions occur which have decreased luminance or do not emit light. Such defective light-emitting regions are easily noticed by users and greatly harm the commercial value of the organic EL element.

The present disclosure has been made in light of the matters described above, and has an aim of providing an organic EL element in which even when an undesired defective light-emitting region is generated, the defective light-emitting region is not conspicuous.

Solution to Problem

In order to achieve the aim described above, an organic EL element that is one aspect of the present disclosure is an EL element comprising: an anode; a cathode; an organic light-emitting layer between the anode and the cathode; and an electron transport layer between the cathode and the organic light-emitting layer, wherein the electron transport layer comprises an n-type dopant that comprises an electron-donating substance, a normal region of the electron transport layer being doped with the n-type dopant at a doping concentration that is higher than a doping concentration at which light emittance efficiency of the organic light-emitting layer is greatest.

Advantageous Effects of Invention

According to the organic EL element that is an aspect of the present disclosure, doping concentration of the n-type dopant with which the electron transport layer is doped is higher than a doping concentration at which light emittance efficiency of the organic light-emitting layer is greatest, and therefore in a region adjacent to a defective light-emitting region light emittance efficiency is increased by a decrease in doping concentration of the n-type dopant. Because light emittance efficiency and luminance are increased in the region adjacent to the defective light-emitting region, apparent size of the defective light-emitting region is decreased and the defective light-emitting region becomes less conspicuous to users.

BRIEF DESCRIPTION OF DRAWINGS

FIG. 4 is an enlargement of the area surrounded by the dashed line A in FIG. 3.

FIG. 5A illustrates a relationship between Ba doping concentration and light emittance efficiency of the organic light-emitting layer of the organic EL element pertaining to embodiment 1. FIG. 5B illustrates a relationship between position in the X direction and doping concentration of the n-type dopant for the organic EL element. FIG. 5C illustrates a relationship between position in the X direction and light emittance efficiency of the organic light-emitting layer for the organic EL element.

FIG. 6A, FIG. 6B, and FIG. 6C illustrate relationships between position in an X direction, doping concentration of an n-type dopant, and light emittance efficiency of the organic light-emitting layer for a conventional organic EL element. FIG. 6A illustrates a relationship between Ba doping concentration and light emittance efficiency of the organic light-emitting layer of the conventional organic EL element. FIG. 6B illustrates a relationship between position in the X direction and doping concentration of the n-type dopant for the conventional organic EL element. FIG. 6C illustrates a relationship between position in the X direction and light emittance efficiency of the organic light--emitting layer for the conventional organic EL element.

FIG. 7A illustrates an enlarged photograph of a defective light-emitting region in which Ba doping concentration is approximately 40 wt %. FIG. 7B illustrates an enlarged photograph of foreign matter that caused the defective light-emitting region illustrated in FIG. 7A. FIG. 7C illustrates an enlarged photograph of a defective light-emitting region in which Ba doping concentration is approximately 20 wt %. FIG. 7D illustrates an enlarged photograph of foreign matter that caused the defective light-emitting region illustrated in FIG. 7C. FIG. 7E illustrates an enlarged photograph of a defective light-emitting region in which Ba doping concentration is approximately 5 wt %. FIG. 7F illustrates an enlarged photograph of foreign matter that caused the defective light-emitting region illustrated in FIG. 7E.

DESCRIPTION OF EMBODIMENT

Figure 1:
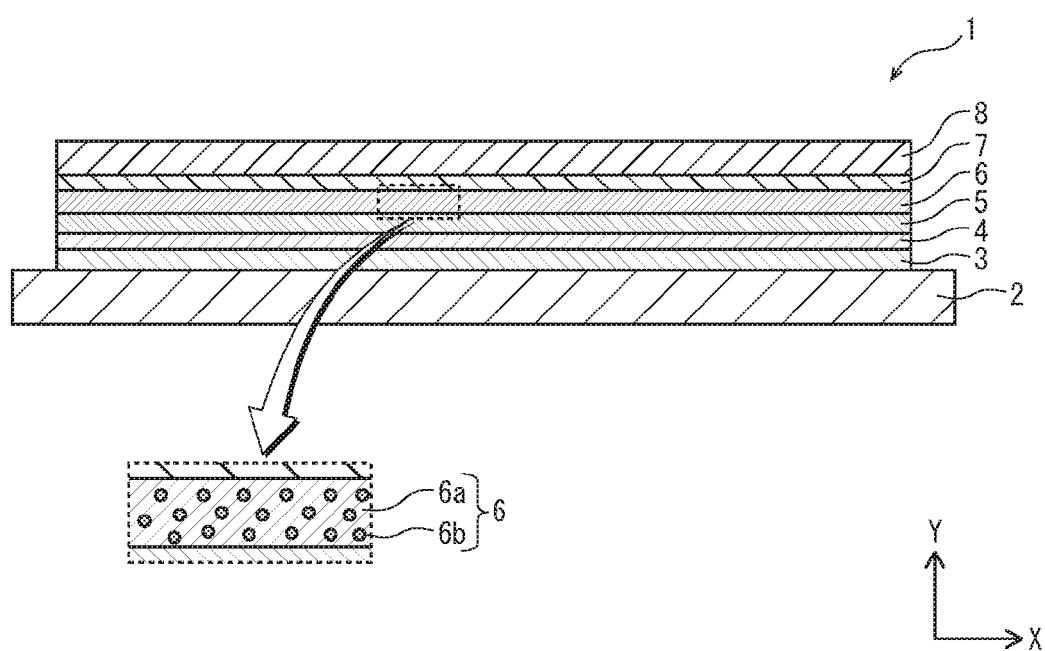
FIG. 1 is a cross-section illustrating an organic EL element pertaining to embodiment 1.

<Summary of One Aspect of the Present Disclosure>

The organic EL element that is one aspect of the present disclosure is an EL element comprising: an anode; a cathode; an organic light-emitting layer between the anode and the cathode; and an electron transport layer between the cathode and the organic light miffing layer, wherein the electron transport layer comprises an n-type dopant that comprises an electron-donating substance, a normal region of the electron transport layer being doped with the n-type dopant at a doping concentration that is higher than a doping concentration at which light emittance efficiency of the organic light-emitting layer is greatest.

Thus, even when a defective light-emitting region occurs, in a region adjacent to the defective light-emitting region, light emittance efficiency of the organic light-emitting layer is increased by a decrease in doping concentration of the n-type dopant in the electron transport layer. Because light emittance efficiency and luminance increase in the region adjacent to the defective light-emitting region, apparent size of the defective light-emitting region decreases, and the defective light-emitting region becomes less conspicuous to users.

Further, according to a specific aspect of the organic EL element pertaining to one aspect of the present disclosure, the organic EL element further comprises a sealing layer on the opposite side of the cathode from the electron transport layer, wherein a crack is present in the sealing layer, the electron transport layer has a graduated region in which the doping concentration of the n-type dopant gradually decreases, the lowest doping concentration in the graduated region being closest to the crack, due to reaction with water or gas that enters via the crack, and the organic light-emitting layer has a region at which light emittance efficiency is greatest, in a region of the organic light-emitting layer corresponding to the graduated region.

Thus, even when a region in which a crack occurs becomes a defective light-emitting region, luminance of the organic light-emitting layer increases at a region in which doping concentration of the n-type dopant decreases in the electron transport layer towards a position closest to the crack. Thus, apparent size of the defective light-emitting region is decreased and the defective light-emitting region becomes less conspicuous to users.

Further, according to a specific aspect of the organic EL element pertaining to one aspect of the present disclosure, the n-type dopant is an alkali metal or alkaline earth metal.

Further, according to a specific aspect of the organic EL element pertaining to one aspect of the present disclosure, the n-type dopant is barium.

Further, according to a specific aspect of the organic EL element pertaining to one aspect of the present disclosure, the doping concentration of the barium is greater than 15 wt %.

When the n-type dopant is barium, light emittance efficiency is greatest when doping concentration in the organic light-emitting layer is 15 wt %. Thus, when doping concentration of barium in the electron transport layer is in a range that is greater than 15 wt %, a region in which light emittance efficiency of the organic light-emitting layer is greatest can exist in a region in which barium doping concentration decreases in the electron transport layer in a direction towards a position closest to the crack.

Further, according to a specific aspect of the organic EL element pertaining to one aspect of the present disclosure, the doping concentration of the barium is greater than or equal to 25 wt %.

When the doping concentration of the barium is greater than or equal to 25 wt %, even when foreign matter of diameter less than 20 μm, which is difficult to eliminate, is mixed in, occurrence of visible defective light-emitting regions can be suppressed.

Further, according to a specific aspect of the organic EL element pertaining to one aspect of the present disclosure, the doping concentration of the barium is less than or equal to 50 wt %.

When the doping concentration of the barium is less than or equal to 50 wt %, the risk of leak currant occurring in the electron transport layer can be suppressed.

Further, an organic EL display panel that is one aspect of the present disclosure comprises the organic EL element described above.

Thus, even when a defective light-emitting region occurs in the organic EL display panel, in a region adjacent to the defective light-emitting region, light emittance efficiency of the organic light-emitting layer is increased by a decrease in doping concentration of the n-type dopant in the electron transport layer. Because light emittance efficiency and luminance increase in the region adjacent to the defective light-emitting region, apparent size of the defective light-emitting region decreases, and the defective light-emitting region becomes less conspicuous to users.

[Embodiment 1]

The following describes an embodiment of the present disclosure, with reference to the drawings.

[Organic EL Element]

FIG. 1 is a cross-section illustrating an organic EL element pertaining to embodiment 1. An organic EL element 1 is a top-emission type organic EL element, and comprises a substrate 2, an anode 3, a hole injection layer 4, an organic light-emitting layer 5, an electron transport layer 6, a cathode 7, and a sealing layer 8.

<Substrate>

The substrate 2 comprises an alkali-free glass, and serves as a substrate for the organic EL element. A thin film transistor (TFT) layer (not illustrated) for driving the organic EL elements is formed on a surface of the substrate 2, and above this the anode 3, an organic functional layer (the hole injection layer 4, the organic light-emitting layer 5, and the electron transport layer 6), and the cathode 7 are layered in this order, forming the organic EL element 1.

As an alternative to the alkali-free glass of the substrate 2, insulating material such as soda glass, non-fluorescent glass, phosphate glass, borate glass, silica glass, acrylic resin, styrene resin, polycarbonate resin, epoxy resin, polyethylene, polyester, silicon resin, or alumina may be used.

<Anode>

The anode 3 has a function of injecting holes to the hole injection layer 4. As a material of the anode 3, aluminium (Al) is used, and the anode 3 is formed by sputtering to form a thickness of approximately 400 nm on the substrate 2.

As an alternative to the aluminium of the anode 3, a light reflective electrically conductive material such as silver (Ag), aluminium alloy, molybdenum (Mo), silver-palladium-copper alloy (APC), silver-rubidium-gold alloy (ARA), molybdenum-chromium alloy (MoCr), molybdenum-tungsten alloy (MoW), nickel-chromium alloy (NiCr), or aluminium-cobalt-germanium-lanthanum alloy (ACL) may be used.

<Hole Injection Layer>

The hole injection layer 4 has a function of promoting injection and transport of holes from the anode 3 to the organic light-emitting layer 5. As a material of the hole injection layer 4, tungsten oxide (WOX) is used, and the hole injection layer 4 is formed by sputtering to form a thickness of approximately 14 nm on the anode 3.

As an alternative to the tungsten oxide of the hole injection layer 4, an oxide such as silver (Ag), molybdenum (Mo), chromium (Cr), vanadium (V), nickel (Ni), or iridium (Ir) may be used, or an electrically conductive polymer material such as poly(3,4-ethylenedioxythiophene) polystyrene sulfonate (PEDOT:PSS) may be used.

<Organic Light-Emitting Layer>

The organic light-emitting layer 5 is a region that emits light according to recombination of carriers (holes and electrons). As a material of the organic light-emitting layer 5, an organic light-emitting polymer is used, and the organic light-emitting layer 5 is formed by inkjet application to form a thickness of approximately 80 nm on the hole injection layer 4.

As an alternative to the organic light-emitting polymer of the organic light-emitting layer 5, a fluorescent material may be used such as poly(para-phenyline vinylene) (PPV), polyfluorene, or, for example, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenyiquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth complex, as disclosed in JP H5-163488.

<Electron Transport Layer>

The electron transport layer 6 comprises an electron transport material 6a and an n-type dopant 6b containing an electron-donating substance. The electron transport layer 6 has a function of transporting electrons injected from the cathode 7 to the organic light-emitting layer 5. In the present embodiment, an organic monomer having an electron transport property is used in the electron transport material 6a, barium (Ba) is used in the n-type dopant 6b, and the electron transport layer is formed at a thickness of approximately 35 nm on the organic light-emitting layer 5. By doping the electron transport material 6a with the n-type dopant 6b, electron movement between the electron donor material 6a and the n-type dopant 6b occurs, forming a charge transfer complex (CT complex). Thus, electron mobility of the electron transport layer 6 is increased, and therefore electrons injected from the cathode 7 are effectively transported to the organic light-emitting layer 5.

Figure 2:
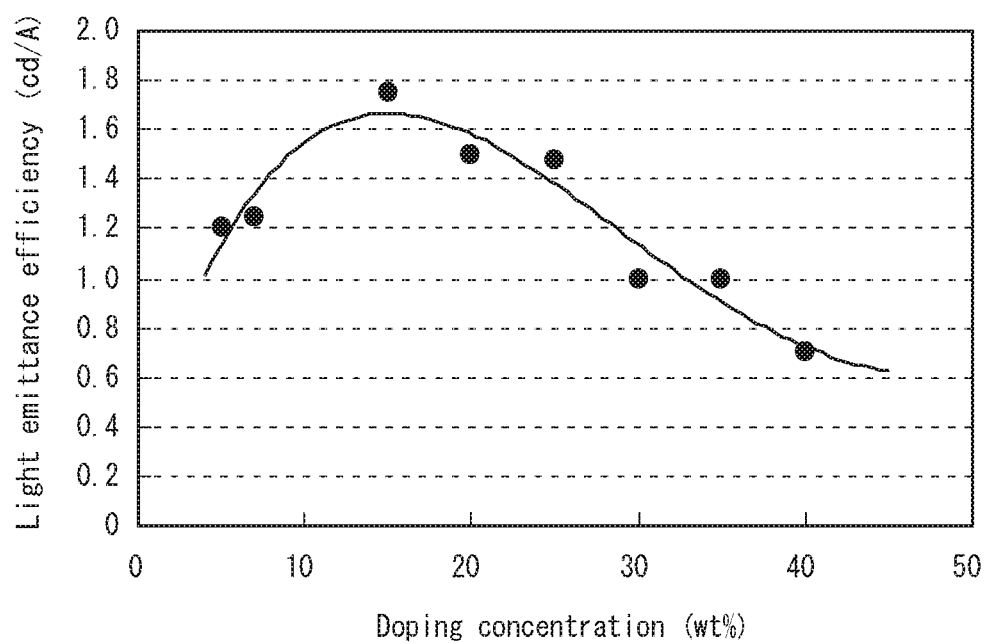
FIG. 2 illustrates a relationship between Ba doping concentration and light emittance efficiency of an organic light-emitting layer of the organic EL element.

FIG. 2 illustrates a relationship between Ba doping concentration and light emittance efficiency of the organic light-emitting layer 5 of the organic EL element. Here, using the materials, methods of layer formation, and layer thicknesses indicated in the present embodiment, examples of the organic EL element having different Ba doping concentrations were manufactured by forming each of the substrate 2, the anode 3, the hole injection layer 4, the organic light-emitting layer 5, the electron transport layer 6, the cathode 7, and the sealing layer 8, and light emittance efficiency of each of the organic EL elements was measured. In FIG. 2, the horizontal axis indicates Ba doping concentration by wt % relative to total weight of the electron transport layer 6, and the vertical axis indicates light emittance efficiency in cd/A of the organic light-emitting layer 5. Light emittance efficiency of the vertical axis is normalized to light emittance efficiency at a doping concentration of 30 wt %.

As indicated in the present drawing, in a range of Ba doping concentration up to and not including 15 wt %, light emittance efficiency of the organic light-emitting layer 5 increases as the Ba doping concentration increases. At Ba doping concentration of 15 wt %, light emittance efficiency of the organic fight-emitting layer 5 reaches a maximum. In a range of Ba doping concentration exceeding 15 wt %, light ernittance efficiency of the organic light-emitting layer 5 decreases as the Ba doping concentration increases.

Here, in order to increase light emittance efficiency of the organic light-emitting layer 5, it is necessary that holes and electrons are injected to the organic light-emitting layer 5 in a balanced ratio. In a case in which injection of either holes or electrons is excessive, recombination of holes and electrons cannot occur efficiently, causing a decrease in light emittance efficiency of the organic light-emitting layer 5.

In the relationship between Ba doping concentration and light emittance efficiency of the organic light-emitting layer 5 illustrated in FIG. 2, it appears that, in the range of Ba doping concentration up to and not including 15 wt %, an amount of electrons injected from the electron transport layer 6 to the organic light-emitting layer 5 is less than an amount of holes injected from the hole injection layer 4 to the organic light-emitting layer 5, and therefore light emittance efficiency of the light-emitting layer 5 increases as the Ba doping concentration increases. At the Ba doping concentration of 15 wt %, it appears that an amount of electrons injected from the electron transport layer 6 to the organic light-emitting layer 5 is substantially equal to an amount of holes injected from the hole injection layer 4 to the organic light-emitting layer 5, and therefore light emittance efficiency of the light-emitting layer 5 achieves a maximum value. In the range of Ba doping concentration exceeding 15 wt %, it appears that an amount of electrons injected from the electron transport layer 6 to the organic light-emitting layer 5 is greater than an amount of holes injected from the hole injection layer 4 to the organic light-emitting layer 5, and therefore light emittance efficiency of the light-emitting layer 5 decreases as the Ba doping concentration increases. This relationship between Ba doping concentration and light emittance efficiency of the light-emitting layer of this organic EL element can also be applied to other typical organic EL elements.

In the present embodiment, the electron transport layer 6 is doped with Ba to a doping concentration higher than the doping concentration at which light emittance efficiency of the light-emitting layer 5 achieves the maximum value. In other words, the electron transport layer 6 is doped with Ba to a concentration that exceeds 15 wt %. Thus, even if a defective light-emitting region occurs in the organic light-emitting layer 5 due to undesired cracks, etc., in the sealing layer 8, apparent size of the defective light-emitting region can be reduced, and the defective light-emitting region made less conspicuous to users. This is described in detail later.

As an alternative to the organic monomer of the electron transport material 6a, organic material such as an oxadiazole derivative (OXD), triazole derivative (TAZ), or phenanthroline derivative (BCP, Bphen) may be used.

As an alternative to the barium of the n-type dopant 6b, an alkali metal such as lithium (Li), sodium (Na), or calcium (K), or an alkaline earth metal such as magnesium (Mg) or calcium (Ca) may be used.

<Cathode>

The cathode 7 has a function of injecting electrons to the electron transport layer 6. As a material of the cathode 7, indium tin oxide (ITO) is used, and the cathode 7 is formed by sputtering to form a thickness of approximately 35 nm on the electron transport layer 6.

As an alternative to the ITO of the cathode 7, a light-transmissive electrically-conductive material comprising an oxide including at least one metal selected from the group consisting of indium, titanium, zinc, and tin, such as indium zinc oxide (IZO), zinc oxide (ZnO), Titanium oxide (TiO2), etc., may be used.

<Sealing Layer>

The sealing layer 8 has a function of sealing the organic functional layer (hole injection layer 4, organic light-emitting layer 5, and electron transport layer 5), and a function of protecting the organic functional layer from external moisture, oxygen, etc. As a material of the sealing layer 8, silicon nitride (Si3N4) is used, and the sealing layer 8 is formed by chemical vapor deposition (CVD) to form a thickness of approximately 600 nm on the cathode 7.

As an alternative to the Si3N4 of the sealing layer 8, silicon oxide (SiO2), silicon oxynitride (SiON), etc., may be used.

[State in Which Crack Has Occurred in Sealing Layer]

The organic EL element 1 is manufactured through the following processes: (1) forming the anode 3 (anode formation), (2) forming the hole injection layer 4 (hole injection layer formation), (4) forming the organic light-emitting layer 5 (organic light-emitting layer formation), (5) forming the electron transport layer 6 (electron transport layer formation), (6) forming the cathode 7 (cathode formation), and (7) forming the sealing layer 8 (sealing layer formation). Each process uses a layer forming method such as sputtering, inkjet printing, vacuum deposition, chemical vapor deposition, etc. Although each layer is formed in a clean environment, it is difficult to ensure that no foreign matter contaminates each layer during manufacturing. In a case in which contamination with foreign matter occurs, cracks and the like may occur in each layer.

Figure 3:
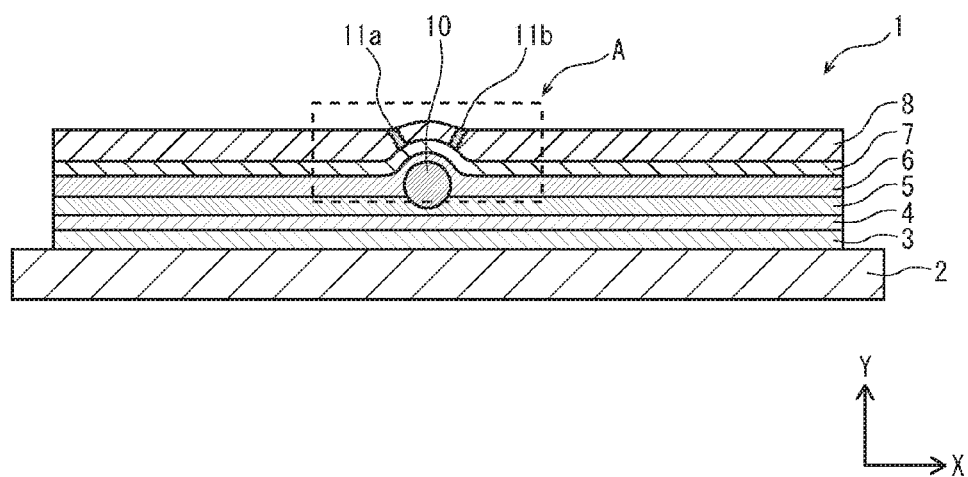
FIG. 3 is a cross-section illustrating a state in which a crack in a sealing layer has occurred in the organic EL element pertaining to embodiment 1.

FIG. 3 is a cross-section illustrating a state in which a crack in a sealing layer has occurred in the organic EL element pertaining to embodiment 1. As indicated in the drawing, foreign matter 10 has contaminated the electron transport layer 6 and a portion of the electron transport layer 6 bulges upward (in the Y direction). Because the organic EL element 1 has a structure in which the anode 3, the hole injection layer 4, the organic light-emitting layer 5, the electron transport layer 6, the cathode 7, and the sealing layer 8 are layered in this order on the substrate 2, in a case in which any layer is not formed flat and irregularity occurs in a surface thereof, a crack may occur in a layer formed thereon. In the example indicated in the drawing, cracks 11a, 11b have occurred in a portion of the sealing layer 8 above the foreign matter 10.

FIG. 4 is an enlargement of the area surrounded by the dashed line A in FIG. 3. In the case in which the cracks 11a, 11b, which are undesired, have occurred in the sealing layer 8, water, gas, etc., enters from the cracks 11a, 11b. The water, gas, etc., that enters passes through the cathode 7 to reach the electron transport layer 6, and reacts with the n-type dopant 6b that the electron transport layer 6 is doped with. Thus, doping concentration of the n-type dopant 6b in the electron transport layer 6 gradually decreases towards positions closest to the cracks 11a, 11b in the electron transport layer 6. Further, the n-type dopant 6b that reacts with the water, gas, etc., loses its electron donating property. Thus, the charge transfer complex formed between the electron transport material 6a and the n-type dopant 6b breaks down, and electron mobility of the electron transport layer 6 decreases.

In the present description, "concentration of n-type dopant" refers to concentration of n-type dopant in the charge transfer complex, and does not include concentration of n-type dopant that has reacted with the water, gas, etc. For example, when the n-type dopant is Ba, concentration of Ba does not include concentration of Ba that has reacted with the water, gas, etc., such as Ba(OH)2 (barium hydroxide).

As a result of the above, the organic EL element 1 comprises a defective light-emitting region B in which luminance is decreased or light is not emitted, a bright light-emitting region C in which luminance of the organic light-emitting layer 5 is increased, and a normal light-emitting region D in which luminance has not changed as a result of the cracks 11a, 11b.

The defective light-emitting region B is located in the vicinity just below the cracks 11a, 11b. In the vicinity just below the cracks 11a, 11b, an amount of the water, gas, etc., that enters is high, and therefore doping concentration of the n-type dopant 6b is 0 wt % or extremely low. Thus, electron mobility of the electron transport layer 6 greatly decreases, and light emittance efficiency of the organic light-emitting layer 5 decreases. As a result, luminance of the organic light-emitting layer 5 decreases or the organic light-emitting layer 5 does not emit light.

The normal light-emitting region D is located a certain distance away from the cracks 11a, 11b, and is not reached by the water, gas, etc., that enters from the cracks 11a, 11b. Thus, doping concentration of the n-type dopant 6b is constant and independent of occurrence of the cracks 11a, 11b, and luminance of the normal light-emitting region D does not change.

The bright light-emitting region C is located between the defective light-emitting region B and the normal light-emitting region D. In the organic EL element 1, the electron transport layer 6 is doped with the n-type dopant 6b to a doping concentration higher than the doping concentration at which light emittance efficiency of the light-emitting layer 5 achieves the maximum value. Thus, even when the n-type dopant 6b reacts with the water, gas, etc., that enters from the cracks 11a, 11b and doping concentration decreases, in a case in which the decrease is small, the light emittance efficiency of the organic light-emitting layer 5 increases. Thus, between the defective light-emitting region B and the normal light-emitting region D, doping concentration of the n-type dopant 6b decreases, causing the light emittance efficiency of the organic light-emitting layer 5 to increase, forming the bright light-emitting region C in which luminance is increased.

Figures 5A, 5B, 5C:
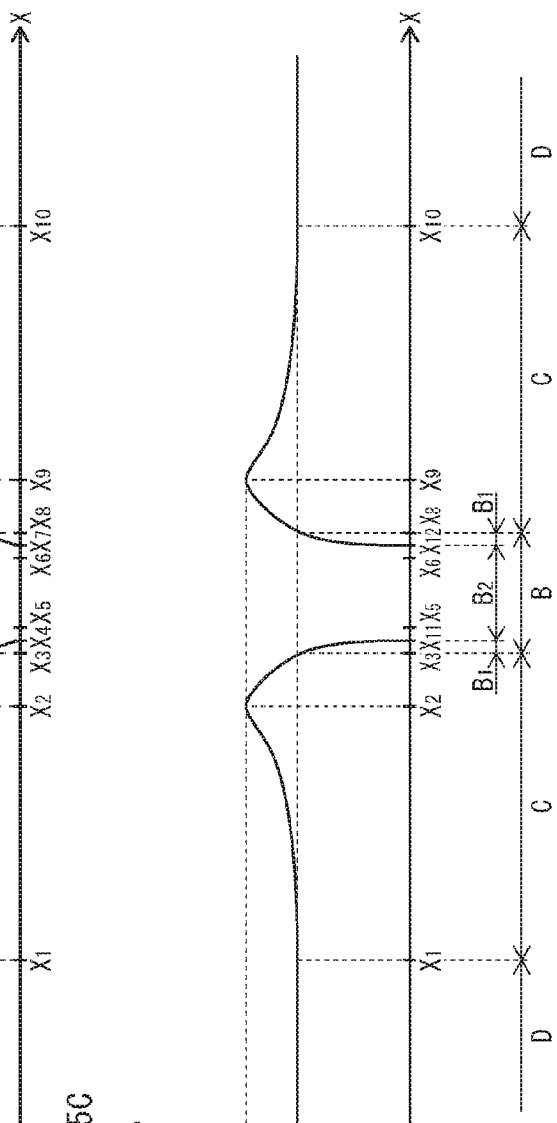
FIG. 5A, FIG. 5B, and FIG. 5C illustrate relationships between position in an X direction, doping concentration of an n-type dopant, and light emittance efficiency of the organic light-emitting layer for the organic EL element pertaining to embodiment 1.

FIG. 5A, FIG. 5B, and FIG. 5C illustrate relationships between position in an X direction, doping concentration of an n-type dopant, and light emittance efficiency of the organic light-emitting layer for the organic EL element pertaining to embodiment 1. FIG. 5A illustrates a relationship between Ba doping concentration and light emittance efficiency of the organic light-emitting layer of the organic EL element pertaining to embodiment 1. FIG. 5B illustrates a relationship between position in the X direction and doping concentration of the n-type dopant for the organic EL element. FIG. 5C illustrates a relationship between position in the X direction and light emittance efficiency of the organic light-emitting layer for the organic EL element.

FIG. 5A illustrates the relationship between Ba doping concentration and light emittance efficiency of the organic light-emitting layer 5 illustrated in FIG. 2, with the vertical and horizontal axes switched. The scale of the vertical axis of FIG. 5A is drawn to match the scale of the vertical axis of FIG. 5B. By referring to FIG. 5A and FIG. 5B, the relationship between position in the X direction and light emittance efficiency of the organic light-emitting layer 5 illustrated in FIG. 5C is obtained.

In FIG. 5B and FIG. 5C, X5 indicates a position of the crack 11a. In a region to the left of X5, Ba doping concentration approaching X5 gradually decreases.

X1 indicates a position at which Ba doping concentration starts decreasing. At X1, doping concentration is approximately 30 wt %, and light emittance efficiency of the organic light-emitting layer 5 is approximately 1.1 cd/A. The region to the left of X1 is the normal light-emitting region D.

Here, referring to FIG. 5A, in a range of doping concentration from approximately 15 wt % to approximately 30 wt %, as Ba doping concentration decreases, light emittance efficiency of the organic light-emitting layer 5 increases. Thus, from the right side of X1, light emittance efficiency of the organic light-emitting layer 5 increases.

X2 is a position at which light emittance efficiency of the organic light-emitting layer 5 is at a maximum. At X2, Ba doping concentration is reduced to approximately 15 wt %, and light emittance efficiency of the organic light-emitting layer 5 is approximately 1.6 cd/A.

Referring to FIG. 5A, in a range of doping concentration equal to or less than approximately 15 wt %, as Ba doping concentration decreases, light emittance efficiency of the organic light-emitting layer 5 decreases. Thus, from the right side of X2, light emittance efficiency of the organic light-emitting layer 5 decreases.

X3 indicates a position at which light emittance efficiency of the organic light-emitting layer 5 is at the same level as light emittance efficiency of the normal light-emitting region D. At X3, doping concentration is approximately 5 wt %, and light emittance efficiency of the organic light-emitting layer 5 is approximately 1.1 cd/A. The region between X2 and X3 is the bright light-emitting region C.

X4 indicates a position at which Ba doping concentration is decreased to 0wt %. Further, X11 indicates a position at which light emittance efficiency of the organic light-emitting layer 5 is 0 cd/A. The region between X3 and X11 is a luminance decreased region B1 in which luminance is decreased in comparison to luminance prior to the cracks 11a, 11b occurring.

X6 indicates a position of the crack 11b. In a region to the right of X6, Ba doping concentration approaching X6 gradually decreases. Changes in Ba doping concentration in the region to the right of X6, and changes in light-emittance of the organic light-emitting layer 5 are similar to changes in the region to the left of X5. X10 indicates a position at which Ba doping concentration starts decreasing, X9 indicates a position at which light emittance efficiency of the organic light-emitting layer 5 reaches a maximum, and X8 indicates a position at which light emittance efficiency of the organic light-emitting layer 5 is at the same level as light emittance efficiency of the normal light-emitting region D. Further, X7 indicates a position at which Ba doping concentration is decreased to 0 wt %, and X12 indicates a position at which light emittance efficiency of the organic light-emitting layer 5 is 0 cd/A.

The region to the right of X10 is the normal light-emitting region D, the region between X10 and X8 is the bright light-emitting region C, and the region between X8 and X12 is the luminance decreased region B1. Further, the region between X11 and X12 is a non-light-emitting region B2. The defective light-emitting region B comprises the luminance decreased region B1 and the non-light-emitting region B2.

As above, in the organic EL element 1, doping concentration of Ba in the electron transport layer 6 is higher than doping concentration at which light emittance efficiency of the organic light-emitting layer 5 is at maximum, and therefore in the region C adjacent to the defective light-emitting region B, decreasing Ba doping concentration increases light emittance efficiency. Because light emittance efficiency and luminance increase in the region C adjacent to the defective light-emitting region B, apparent size of the defective light-emitting region B decreases, and the defective light-emitting region B becomes less conspicuous to users.

The following describes a case in which a crack occurs in a sealing layer in a conventional organic EL element. FIG. 6A, FIG. 6B, and FIG. 6C illustrate relationships between position in an X direction, doping concentration of an n-type dopant, and light emittance efficiency of the organic light-emitting layer for a conventional organic EL element. FIG. 5A illustrates a relationship between Ba doping concentration and light emittance efficiency of the organic light-emitting layer of the conventional organic EL element. FIG. 5B illustrates a relationship between position in the X direction and doping concentration of the n-type dopant tor the conventional organic EL element. FIG. 5C illustrates a relationship between position in the X direction and light emittance efficiency of the organic light-emitting layer for the conventional organic EL element.

FIG. 6A illustrates the relationship between Ba doping concentration and light emittance efficiency of the organic light-emitting layer illustrated in FIG. 2, with the vertical and horizontal axes switched. The scale of the vertical axis of FIG. 6A is drawn to match the scale of the vertical axis of FIG. 6B. By referring to FIG. 6A and FIG. 6B, the relationship between position in the X direction and light emittance efficiency of the organic light-emitting layer illustrated in FIG. 6C is obtained.

Here, the n-type dopant is a dopant in the electron transport layer for increasing electron mobility of the electron transport layer and increasing light emittance efficiency of the organic light-emitting layer. Thus, conventionally, the n-type dopant is a dopant in the electron transport layer at a doping concentration less than or equal to a doping concentration at which light emittance efficiency of the organic light-emitting layer is at maximum. In the example indicated in FIG. 6A, FIG. 6B, and FIG. 6C, the electron transport layer is doped with Ba to approximately 10 wt %.

X5 indicates a position of the crack 11a, and in a region to the left of X5, Ba doping concentration gradually decreases approaching X5.

X21 indicates a position at which Ba doping concentration starts decreasing. At X21, doping concentration is approximately 10 wt %, and light emittance efficiency of the organic light-emitting layer 5 is approximately 1.5 cd/A. The region to the left of X21 is a normal light-emitting region D1.

Here, referring to FIG. 6A, in a range of doping concentration equal to or less than approximately 15 wt %, as Ba doping concentration decreases, light emittance efficiency of the organic light-emitting layer decreases. Thus, from the right side of X21, light emittance efficiency of the organic light-emitting layer decreases.

X22 indicates a position at which Ba doping concentration is decreased to 0 wt %. Further, X25 indicates a position at which light emittance efficiency of the organic light-emitting layer is 0 cd/A. The region between X21 and X25 is a luminance decreased region B4 in which luminance is decreased in comparison to luminance prior to the cracks 11a, 11b occurring.

X6 indicates a position of the crack 11b, and in a region to the right of X6, Ba doping concentration gradually decreases approaching X6. Changes in Ba doping concentration in the region to the right of X6, and changes in light-emittance of the organic light-emitting layer are similar to changes in the region to the left of X5. X24 indicates a position at which Ba doping concentration starts decreasing, X23 indicates a position at which Ba doping concentration is decreased to 0 wt %, and X26 indicates a position at which light emittance efficiency of the organic light-emitting layer is 0 cd/A.

The region to the right of X24 is the normal light-emitting region D1, the region between X24 and X26 is the luminance decreased region D4, and the region between X25 and X26 is a non-light-emitting region B5. The defective light-emitting region B3 comprises the luminance decreased region B4 and the non-light-emitting region B5.

[Effects]

In the following, the organic EL element 1 and the conventional organic EL element are compared when a crack has occurred in their respective sealing layers.

(1) Size of Non-Light-Emitting Region

Because Ba doping concentration in the electron transport layer is higher in the organic EL element 1 than in the conventional organic EL element, a length from the position X5 of the crank 11a to the position X11 at which light emittance efficiency of the organic light-emitting layer in the organic EL element 1 is 0 cd/A is shorter than a length from the position X5 of the crack 11a to the position X25 at which light emittance efficiency of the organic light-emitting layer in the conventional organic EL element is 0 cd/A. Likewise, a length from the position X6 of the crack 11b to the position X12 at which light emittance efficiency of the organic light-emitting layer in the organic EL element 1 is 0 cd/A is shorter than a length from the position X6 of the crack 11b to the position X26 at which light emittance efficiency of the organic light-emitting layer in the conventional organic EL element is 0 cd/A. Accordingly, the non-light-emitting region B2 in the organic EL element 1 is smaller than the non-light-emitting region B5 in the conventional organic EL element.

(2) Size of Luminance Decreased Region

Light emittance efficiency of the normal light-emitting region D of the organic EL element 1 is lower than light emittance efficiency of the normal light-emitting region D1 of the conventional organic EL element. Thus, a length in the organic EL element 1 from the position X3 at which light emittance efficiency is at the same level as light emittance efficiency at the normal light-emitting region D to the position X11 at which light emittance efficiency of the organic light-emitting layer is 0 cd/A is shorter than a length in the conventional organic EL element from the position X21 at which light emittance efficiency is at the same level as light emittance efficiency at the normal light-emitting region D1 to the position X25 at which light emittance efficiency of the organic light-emitting layer is 0 cd/A. Accordingly, the luminance decreased region B1 in the organic EL element 1 is smaller than the luminance decreased region B4 in the conventional organic EL element.

Further, because the non-light-emitting region and the luminance decreased region are smaller in the organic EL element 1 than in the conventional organic EL element, the defective light-emitting region comprising the non-light-emitting region and the luminance decreased region is also smaller in the organic EL element 1 than in the conventional organic EL element.

(3) Apparent Size of Defective Light-Emitting Region

The bright light-emitting region C of the organic EL element 1 is adjacent to the defective light-emitting region B. Luminance of the bright light-emitting region C interpolates with darkness of the defective light-emitting region B, and therefore apparent size of the defective light-emitting region B is decreased. Thus, the defective light-emitting region B becomes less conspicuous to users.

[Experimental Verification]

In order to verify the effects described above of the organic EL element pertaining to the present embodiment, the following experimental verification was performed.

Figure 7A:
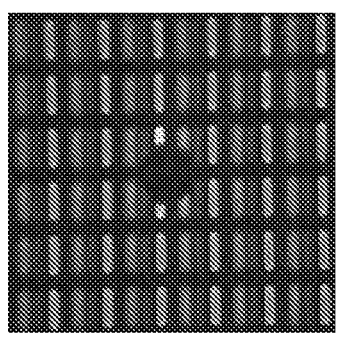
FIG. 7A, FIG. 7B, FIG. 7C, FIG. 7D, FIG. 7E, and FIG. 7F illustrate enlarged photographs of defective light-emitting regions that have been contaminated with foreign matter.
Figure 7B:
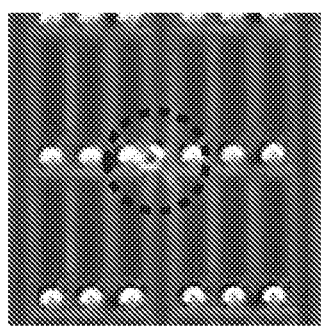
Figure 7C:
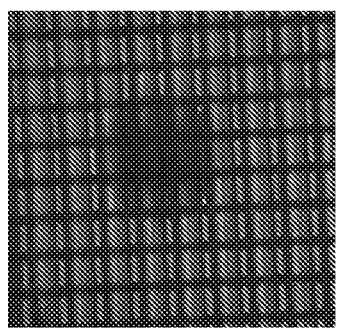
Figure 7D:
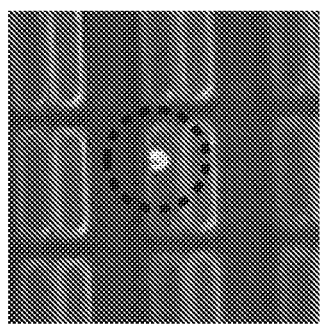
Figure 7E:
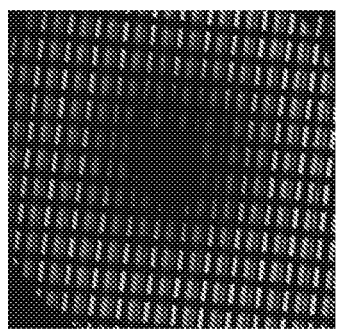
Figure 7F:
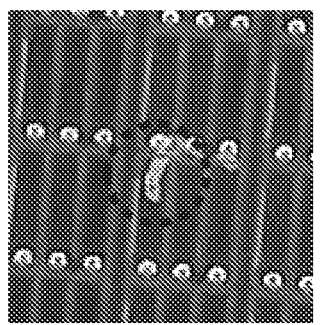

FIG. 7A, FIG. 7B, FIG. 7C, FIG. 7D, FIG. 7E, and FIG. 7F illustrate enlarged photographs of defective light-emitting regions that have been contaminated with foreign matter. FIG. 7A illustrates an enlarged photograph of a defective light-emitting region in which Ba doping concentration was approximately 40 wt %. FIG. 7B illustrates an enlarged photograph of foreign matter that caused the defective light-emitting region illustrated in FIG. 7A. FIG. 7C illustrates an enlarged photograph of a defective light-emitting region in which Ba doping concentration was approximately 20 wt %. FIG. 7D illustrates an enlarged photograph of foreign matter that caused the defective light-emitting region illustrated in FIG. 7C. FIG. 7E illustrates an enlarged photograph of a defective light-emitting region in which Ba doping concentration was approximately 5 wt %. FIG. 7F illustrates an enlarged photograph of foreign matter that caused the defective light-emitting region illustrated in FIG. 7E.

In FIG. 7B, FIG. 7D, and FIG. 7F, the foreign matter is within the area enclosed by a dashed line, and was in each case approximately 30 μm across.

Here, referring to FIG. 7A, when Ba doping concentration was approximately 40 wt %, size of the defective light-emitting region was approximately four pixels in a two by two grid. Further, referring to FIG. 7C, when Ba doping concentration was approximately 20 wt %, size of the defective light-emitting region was approximately nine pixels in a three by three grid. Further, referring to FIG. 7E, when Ba doping concentration was approximately 5 wt %, size of the defective light-emitting region was approximately 25 pixels in a five by five grid. Thus, it can be seen that as Ba doping concentration increases, size of the defective light-emitting region decreases. Further, referring to FIG. 7A, when Ba doping concentration was approximately 40 wt %, it can be seen that luminance around the defective light-emitting region was higher than in other regions. Thus, apparent size of the defective light-emitting region was decreased and the defective light-emitting region B became less conspicuous to users.

Figure 8:
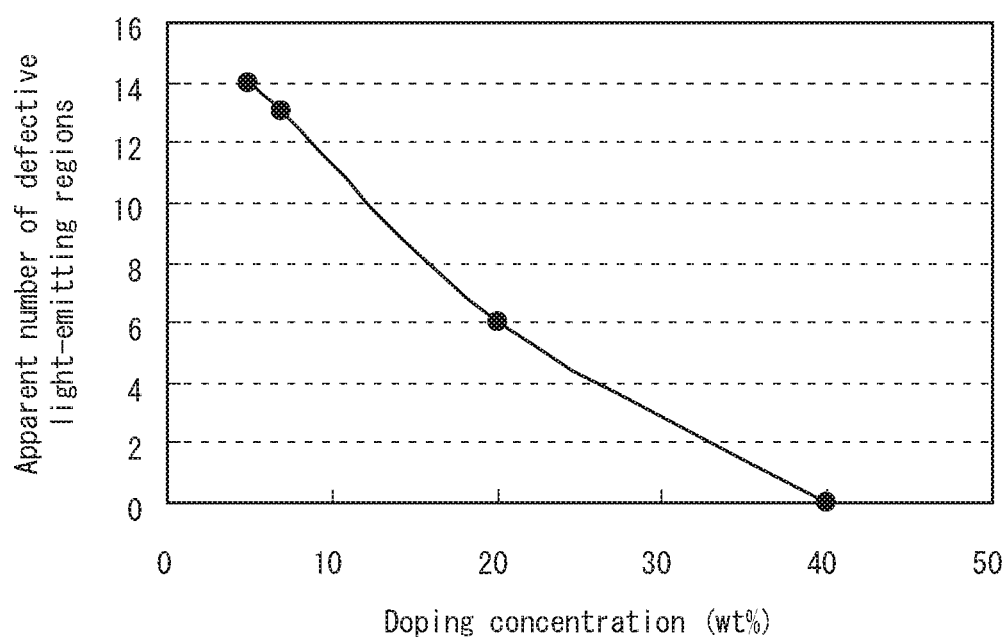
FIG. 8 illustrates a relationship between Ba doping concentration and apparent number of defective light-emitting regions of the organic EL element.

FIG. 8 illustrates a relationship between Ba doping concentration and apparent number of defective light-emitting regions of the organic EL element. The horizontal axis indicates Ba doping concentration by wt % relative to total weight of the electron transport layer and the vertical axis indicates apparent number of defective light-emitting regions. Here, with respect to 1600 by 1200 pixel 20 inch organic EL display panels comprising the organic EL element at varying Ba doping concentrations, the number of defective light-emitting regions in which luminance was decreased or light was not emitted were counted by unaided visual observation.

Referring to FIG. 8, as Ba doping concentration increased the apparent number of defective light-emitting regions decreased, and when the Ba doping concentration was approximately 40 wt % the apparent number of defective light-emitting regions was zero.

<Modification 1>

According to the embodiment above, the electron transport layer is doped with Ba to a concentration greater than 15 wt %. This Ba doping concentration in the electron transport layer is preferably at least 25 wt %. The reason for this is described below.

Figure 9:
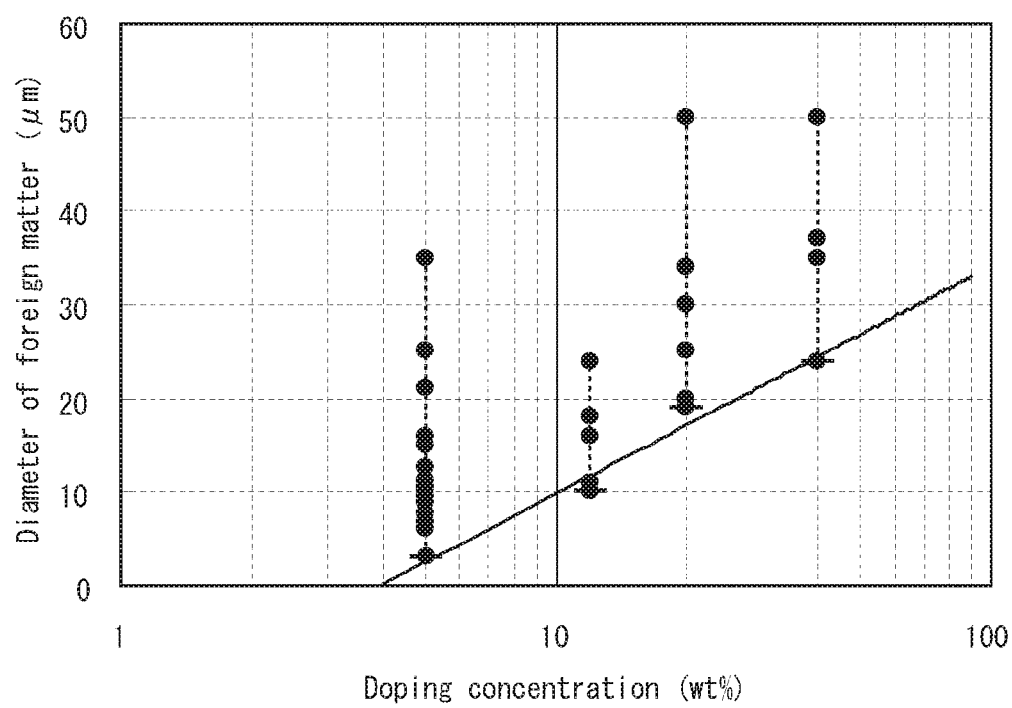
FIG. 9 illustrates a relationship between diameter of foreign matter that caused defective light-emitting regions and Ba doping concentration of the organic EL element, in cases in which visible defective light-emitting regions occurred.

FIG. 9 illustrates a relationship between diameter of foreign matter that caused defective light-emitting regions and Ba doping concentration of the organic EL element, in cases in which visible defective light-emitting regions occurred. The horizontal axis indicates Ba doping concentration by wt % relative to total weight of the electron transport layer and the vertical axis indicates diameter of foreign matter in micrometers.

Referring to FIG. 9, for example when foreign matter of diameter 10 μm was mixed in, a visible defective light-emitting region occurred in an organic EL element at a Ba doping concentration of 5 wt %. In contrast, even when foreign matter of the same diameter 10 μm was mixed in, a visible defective light-emitting region did not occur in an organic EL element at a Ba doping concentration of 30 wt %.

The straight line in FIG. 9 connects, for each Ba doping concentration, diameter of the smallest foreign matter that caused a visible defective light-emitting region, according to a logarithmic approximation. When Ba doping concentration is N wt % and diameter of the smallest foreign matter that caused a visible defective light-emitting region is D μm, the straight line is expressed by the following equation.

$$N \geq 4 \times \exp(0.0095 \times D)$$

Typically, diameter of foreign matter that is easily excluded is approximately greater than or equal to 20 μm. Foreign matter of diameter less than 20 μm is difficult to exclude. In order that a visible defective light-emitting region does not occur even when contaminated with foreign matter of diameter less than 20 μm, it can be seen from FIG. 9 and the above equation that Ba doping concentration of approximately 25 wt % and greater is sufficient.

<Modification 2>

The present disclosure may be implemented as an organic EL display panel comprising the organic EL element pertaining to the embodiment above, and may be implemented as an organic EL display device comprising the organic EL display panel.

Figure 10:
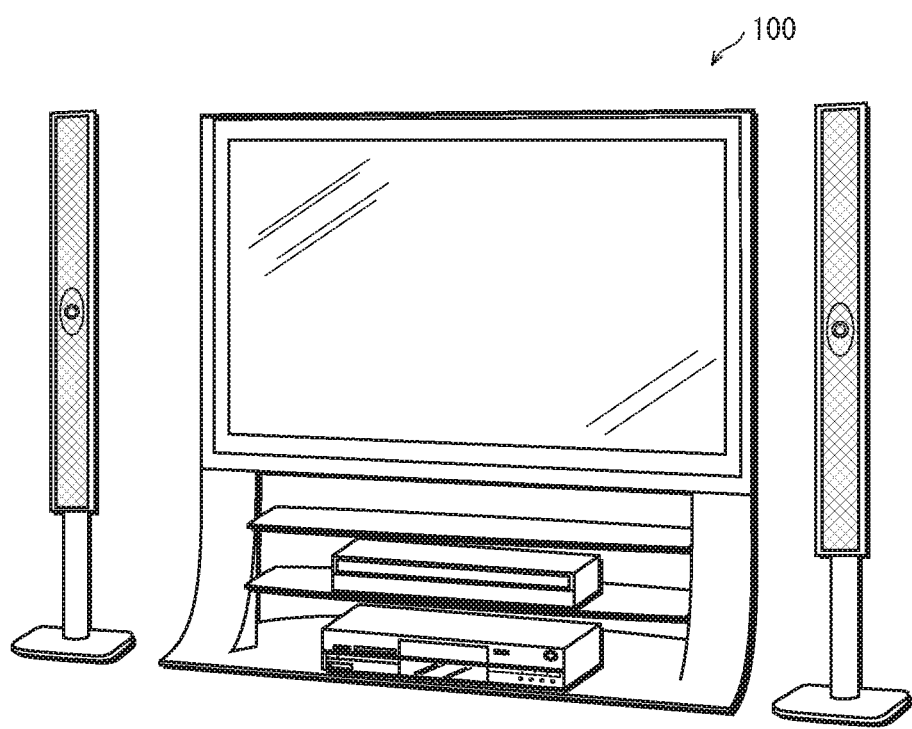
FIG. 10 is an external view illustrating an organic EL display device pertaining to a modification.
Figure 11:
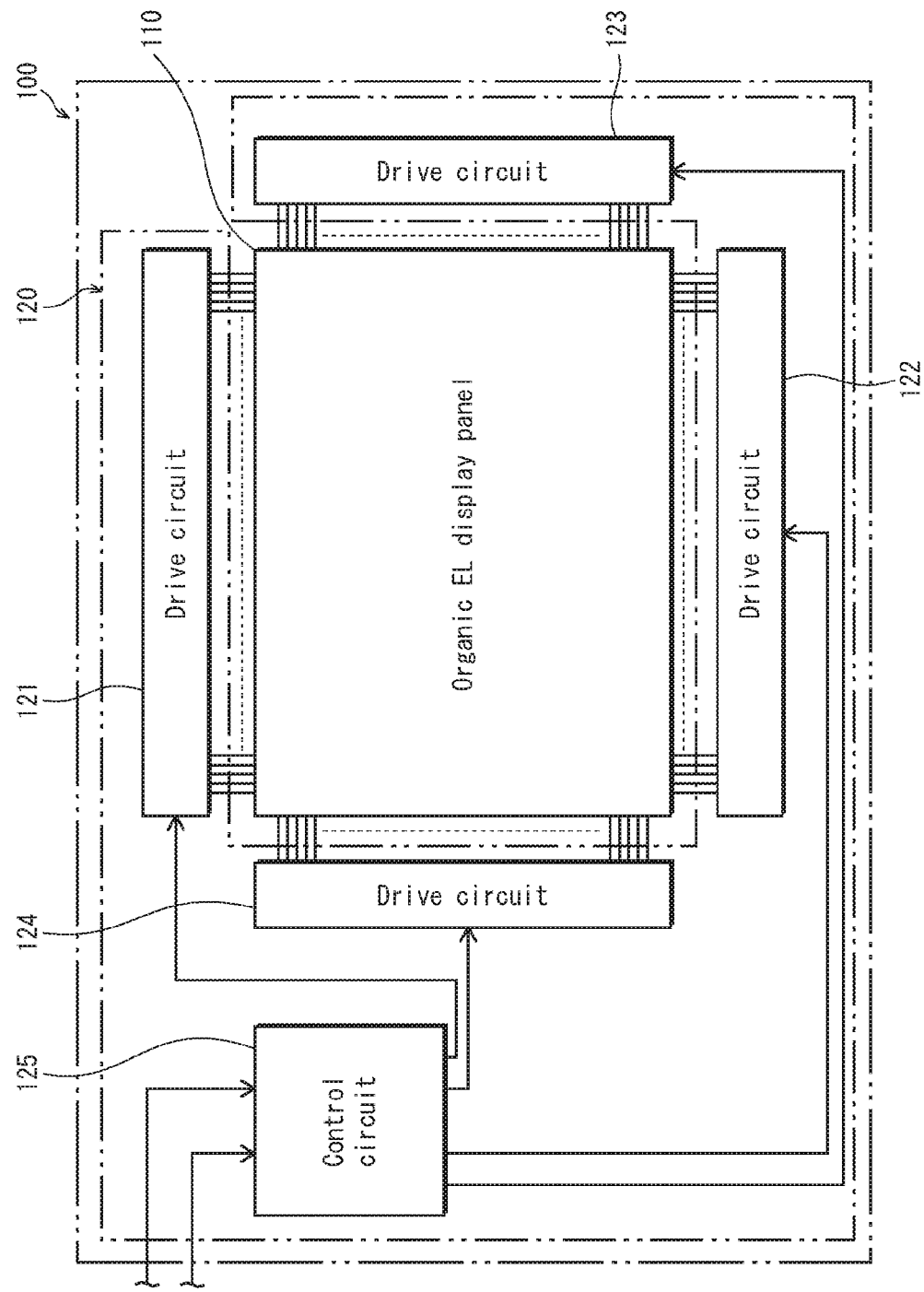
FIG. 11 is a schematic block diagram of an organic EL display device pertaining to a modification.

FIG. 10 is an external view illustrating the organic EL display device pertaining to a modification. FIG. 11 is a schematic block diagram of the organic EL display device pertaining to the modification. As indicated in FIG. 11, an organic EL display device 100 comprises an organic EL display panel 110 and a drive controller 120 connected to the organic EL display panel 110. The organic EL display panel 110 comprises a plurality of the organic EL element pertaining to the embodiment above, arranged, for example, in a matrix. The driver controller 120 comprises four drive circuits 121-124 and a control circuit 125. According to the organic EL display device 100 and the organic EL display panel 110, even if an undesired defective light-emitting region occurs, light emittance efficiency and luminance is increased in a region adjacent to the defective light-emitting region. Thus, apparent size of the defective light-emitting region is decreased and the defective light-emitting region becomes less conspicuous to users.

<Supplement>

The present disclosure has been described based on the embodiment above, but is of course not limited to the embodiment described above. Cases such as described below are also included in this disclosure.

(a) Ba doping concentration in the electron transport layer is preferably less than or equal to 50 wt %. This is in order to ensure a certain level of light emittance efficiency in the normal light-emitting region. Further, the risk of leaking current is low in a range of Ba doping concentration less than or equal to 50 wt %.

(b) In the embodiment above, a case is described in which a crack occurs in the sealing layer due to contamination with foreign matter during layer formation processing of the organic EL element, but the present disclosure is not necessarily limited to this example. For example, a crack may occur in the sealing layer as a result of a user applying excessive force to the sealing layer during use of the organic EL element. Further, during layer formation processing of the organic EL element, any layer might not be formed flat for any reason, and as a result of surface irregularity that occurs, a crack may occur in a layer formed on the surface irregularity.

(c) According to the embodiment above, the organic EL element comprises the substrate, the anode, the hole injection layer, the organic light-emitting layer, the electron transport layer, the cathode, and the sealing layer. However, the present. disclosure is not limited to this example. As long as the organic EL element comprises the anode, the cathode, the organic light-emitting layer, and the electron transport layer between the cathode and the organic light-emitting layer that transports electrons from the cathode to the organic light-emitting layer, any number of other organic functional layers may be included in the organic EL element.

For example, between the cathode and the electron transport layer may be an electron injection layer that has a function of promoting injection of electrons from the cathode to the electron transport layer. As a material of the electron injection layer, a low work function metal such as lithium, barium, calcium, potassium, cesium, sodium, rubidium, etc.; a low work function metal salt such as lithium fluoride; a low work function metal oxide such as barium oxide; etc., is preferable.

Further, between the organic light-emitting layer and the hole injection layer may be a hole transport layer that has a function of transporting holes injected from the anode to the organic light-emitting layer. As a material of the hole transport layer, for example, as disclosed in JP H5-163488, a triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styryl anthracene derivative, fluorenone derivative, hydrazone derivative, stilbene derivative, porphyrin compound, aromatic tertiary class amine compound, styrylamine compound, butadiene compound, polystyrene derivative, hydrazone derivative, triphenylmethane derivative, tetraphenyl benzene derivative, etc., is preferable.

Further, above the sealing layer, a resin layer may be provided that protects the organic EL element. As a material of the resin layer, a resin material such as epoxy resin, acrylic resin, urethane resin, etc., is preferable.

(d) According to the embodiment above, a top-emission type of organic EL element is indicated that emits light from the cathode side of the organic EL element, but the present disclosure is not limited to this example. The organic EL element may be a bottom-emission type that emits light from the substrate side of the organic EL element. In the organic EL element that is a bottom-emission type, a light-transmissive material such as ITO, IZO, etc., is used in the anode.

(e) According to the embodiment above, layers of the organic EL element are formed by using processes such as sputtering, inkjet printing, vacuum deposition, chemical vapor deposition, etc., but the present disclosure is not limited to these examples. The layer-forming processes described above are examples and not limiting.

INDUSTRIAL APPLICABILITY

The organic EL element pertaining to one aspect of the present disclosure is, for example, applicable as an organic EL element used in various display devices, television devices, displays for portable electronic devices, etc., for household, public, or commercial use.

REFERENCE SIGNS LIST 1 organic EL element
2 substrate
3 anode
4 hole injection layer
5 organic light-emitting layer
6 electron transport layer
6a electron transport material
6b n-type dopant
7 cathode
8 sealing layer
10 foreign matter
11a, 11b crack
100 organic EL display device
110 organic EL display panel

The invention claimed is:

1. An organic electroluminescence (EL) element comprising:
   an anode;
   a cathode;
   an organic light-emitting layer between the anode and the cathode;
   an electron transport layer between the cathode and the organic light-emitting layer; and
   a sealing layer on an opposite side of the cathode from the electron transport layer, wherein
   the electron transport layer comprises an n-type dopant that comprises an electron-donating substance, a normal region of the electron transport layer being doped with the n-type dopant at a doping concentration that is higher than a doping concentration at which light emittance efficiency of the organic light-emitting layer is greatest,
   a crack is in the sealing layer, and
   the electron transport layer has a graduated region in which the doping concentration of the n-type dopant gradually decreases, a lowest doping concentration in the graduated region being closest to the crack.

2. The organic EL element of claim 1,
wherein
the organic light-emitting layer has a region at which light emittance efficiency is greatest, in a region of the organic light-emitting layer corresponding to the graduated region.

3. The organic EL element of claim 1, wherein
the n-type dopant is an alkali metal or alkaline earth metal.

4. The organic EL element of claim 1, wherein
the n-type dopant is barium.

5. The organic EL element of claim 4, wherein
the doping concentration of the barium is greater than 15 wt %.

6. The organic EL element of claim 4, wherein
the doping concentration of the barium is greater than or equal to 25 wt %.

7. The organic EL element of claim 5, wherein
the doping concentration of the barium is less than or equal to 50 wt %.

8. An organic EL display panel comprising:
the organic EL element of claim 1.

9. The organic EL element of claim 1, wherein
the graduated region is due to reaction with water or gas that enters via the crack.

* * * * *